United States Patent [19]
Masumo et al.

[11] Patent Number: 5,306,651
[45] Date of Patent: Apr. 26, 1994

[54] PROCESS FOR PREPARING A POLYCRYSTALLINE SEMICONDUCTOR THIN FILM TRANSISTOR

[75] Inventors: Kunio Masumo, Yokohama; Masanori Yuki, Hadano, both of Japan

[73] Assignee: Asahi Glass Company Ltd., Tokyo, Japan

[21] Appl. No.: 698,092

[22] Filed: May 10, 1991

[30] Foreign Application Priority Data

May 11, 1990 [JP] Japan ................................ 1-20111
May 15, 1990 [JP] Japan ................................ 1-22938

[51] Int. Cl.$^5$ ............................................ H01L 21/265
[52] U.S. Cl. ................................... 437/40; 437/173; 437/908; 437/907; 148/DIG. 91
[58] Field of Search ................. 437/40, 173, 908, 907; 148/DIG. 91

[56] References Cited

U.S. PATENT DOCUMENTS 4,545,823  10/1985  Drowley .

FOREIGN PATENT DOCUMENTS 0236953  9/1987  European Pat. Off. .
104117   5/1987  Japan .
62-104117 5/1987  Japan .

OTHER PUBLICATIONS

T. Sameshima & S. Usui "XeCl Excimer Laser Annealing Used to Fabricate Poly-Si TFTs" Mat Res Soc Symp Proc vol. 71 (1986) pp. 435–440.
Applied Physics Letters, vol. 40, No. 26, pp. 469–471, Mar. 15, 1982, R. A. Lemons, et al., "Laser Crystallization of Si Films on Glass".
Electronics Letters, vol. 15, No. 25, pp. 827–828, Dec. 6, 1979, S. Iwamatsu, et al., "Silicon-On-Sapphire M.O.S.F.E.T.S Fabricated by Back-Surface Laser-Anneal Technology".
IEEE Transactions of Electron Devices, vol. 36, No. 12, pp. 2868–2872, Dec., 1989, K. Sera, et al., "High-Performance TFT's Fabricated by XeCl Excimer Laser Annealing of Hydrogenated Amorphous-Silicon Film".
Fujitsu-Scientific and Technical Journal, vol. 23, No. 2, pp. 71–86, Jun., 1987, M. Nakano, "Three-Dimensional ICs at Fujitsu".

Primary Examiner—Brian E. Hearn
Assistant Examiner—Linda J. Fleck
Attorney, Agent, or Firm—Oblon, Spivak, McClelland, Maier & Neustadt

[57] ABSTRACT

A process for preparing a polycrystalline semiconductor thin film transistor wherein a non-singlecrystalline semiconductor formed on a transparent insulating substrate is annealed by laser beams, such process comprising forming a gate insulation layer and a gate electrode on the non-singlecrystalline semiconductor; implanting impurity ions into a source-drain region of the semiconductor wherein the gate electrode is used as a mask, and irradiating laser beams from the rear surface side of the transparent insulating substrate to thereby polycrystallize the non-singlecrystalline semiconductor under the gate electrode or improve the crystallinity of the semiconductor without causing the non-singlecrystalline semiconductor in a completely molten state.

5 Claims, 3 Drawing Sheets

PROCESS FOR PREPARING A POLYCRYSTALLINE SEMICONDUCTOR THIN FILM TRANSISTOR

FIELD OF THE INVENTION

The present invention relates to a process for preparing a polycrystalline semiconductor thin film transistor or the like used for driving an image displaying device or the like. More particularly, the present invention relates to the polycrystallization of an amorphous semiconductor by the irradiation of laser beams which has become a center of attraction.

DISCUSSION OF THE BACKGROUND

Recently, there has been actively developed thin film transistors (TFT's) for the purpose of the application of them to image display devices for plane type displays. While polycrystalline semiconductor TFTs have advantages of high performance, high reliability and so on in comparison with those which use an amorphous semiconductor thin film, they are disadvantageous in that a high temperature is required to form a thin film. Accordingly, studies on and the application of a technique of crystallization of amorphous TFTs obtained by irradiating laser beams, which unnecessitates high temperature processing for the production of polycrystalline semiconductor thin films, have been actively conducted.

An attempt of reducing unwanted capacitance between the gate and the drain of a TFT in order to improve the operating speed has been made. In this case, a method of forming a gate electrode (hereinbelow, referred to as a gate) in a self-aligning manner with respect to a source electrode (hereinbelow, referred to as a source) and a drain electrode (hereinbelow, referred to as a drain) is remarkably effective.

Figure 3A:
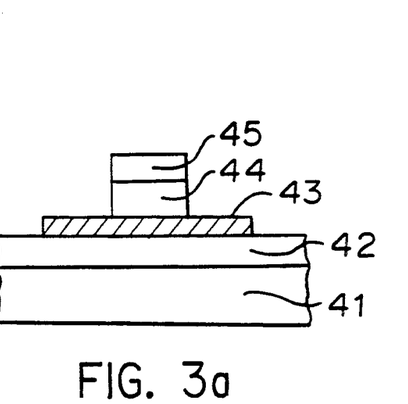
FIG. 3a is a cross-sectional view showing the initial stage of a conventional process for preparing a thin film transistor.
Figure 3B:
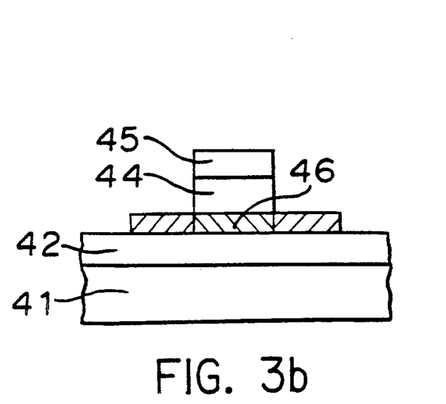

A conventional process of forming a polycrystalline TFT with use of laser beams wherein a source-drain region is formed in a self-aligning manner with respect to the gate by an ion implantation method will be described with reference to FIG. 3. FIG. 3a is a cross-sectional view showing the initial stage of the conventional process for preparing the TFT, and FIG. 3b is a cross-sectional view showing the stage next to the stage as shown in FIG. 3a.

First of all, a passivation film 42 and an amorphous semiconductor layer 43 are deposited on an insulating substrate 41. Then, laser beams are irradiated on the laminated article to form a polycrystalline portion in the amorphous semiconductor layer 43. A pattern of polycrystalline semiconductor thin film 46 is formed on the passivation layer 42 by a photolithography method. A gate insulating film 44 and an electric conductive material 45 which serves as the gate electrode are deposited on the polycrystalline semiconductor thin film 46. Again, a pattern of gate is formed on the electric conductive material 45 by the photolithography method. In this case, the gate insulating film is etched to have the same pattern as the gate. Impurity ions are doped in the polycrystalline semiconductor layer 46 by the ion implantation method while the gate is used as a mask, followed by heat treating to effect impurity ion activation, whereby the source-drain region is formed. Further, an interlayer insulating film is formed on the source-drain region, and contact holes are formed in it. Thus, the source and the drain are respectively formed on the contact holes.

Such a conventional method wherein the impurity ions are activated by the heat treatment has the following disadvantage. Namely, when a material having good processability and a low heat resistance, such as glass, is used as the substrate, the material can not be heated at a sufficiently high temperature for the activation of the impurity ions, hence, the resistance in the source-drain region can not sufficiently be reduced. Further, a demand of using a material having good heat resistance such as quartz (which, on the other hand, deteriorates processability) in order to obtain a heat treatment of a sufficiently high temperature, is contrary to a demand of using a substrate having a large surface area. Accordingly, the conventional technique is insufficient to realize a display having a large surface area and to prepare a plurality of thin film products from a single substrate having a large surface area in order to reduce the manufacturing cost.

SUMMARY OF THE INVENTION

In accordance with the present invention, there is provided a process for preparing a polycrystalline semiconductor thin film transistor wherein a non-singlecrystalline semiconductor formed on a transparent insulating substrate is annealed by laser beams, said process being characterized by forming a gate insulation layer and a gate electrode on said non-singlecrystalline semiconductor; implanting impurity ions into a source-drain region of said semiconductor wherein the gate electrode is used as a mask, and irradiating laser beams from the rear surface side of the transparent insulating substrate to thereby polycrystallize the non-singlecrystalline semiconductor under the gate electrode or improve the crystallinity of said semiconductor without causing said non-singlecrystalline semiconductor in a completely molten state.

BRIEF DESCRIPTION OF THE DRAWINGS

In the drawing;

FIG. 1b is a cross-sectional view showing a manufacturing step next to the initial stage as shown in FIG. 1a;

FIG. 2b is a cross-sectional view showing a step next to the stage as shown in FIG. 2a;

FIG. 3b is a cross-sectional view showing a step next to the stage as shown in FIG. 3a.

DESCRIPTION OF THE PREFERRED EMBODIMENTS

Preferred embodiments of the process for preparing a polycrystalline semiconductor thin film transistor will be described with reference to the drawings.

Figure 1A:
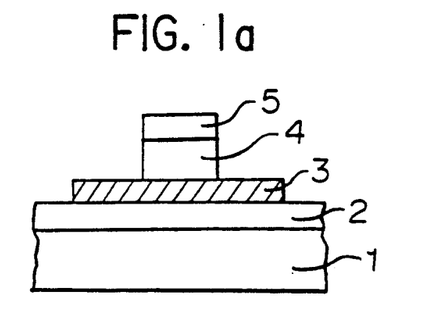
FIG. 1a is a cross-sectional view showing the initial stage of an embodiment of the process for preparing a polycrystalline semiconductor thin film transistor according to the present invention.
Figure 1B:
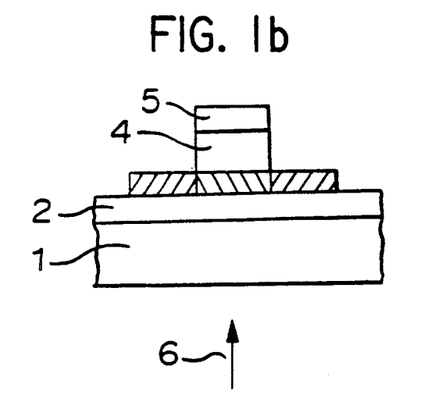
Figure 1C:
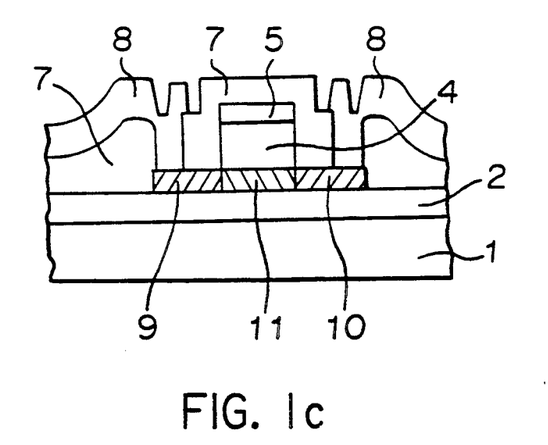
FIG. 1c is a cross-sectional view showing the final stage of the process according to the first embodiment of the present invention.

Referring to FIG. 1a-1c, a passivation film 2 of a single layer or a multilayer formed of SiOx, SiNx, SiOxNy, TaOx or the like is formed in a film thickness range of 50-1,000 nm on a transparent insulating substrate 1 such as glass, ceramic, plastic or the like with use of a plasma CVD method, a sputtering method, an LP CVD method, an atmospheric pressure CVD method or the like. Then, an amorphous semiconductor layer 3 such as Si, Ge or the like which becomes a non-singlecrystalline semiconductor is formed on the passivation film in a film thickness range of 10-500 nm. When the film thickness is less than 10 nm, the crystallinity is poor. The electric characteristics of the thus obtained TFT is poor and the usable range of a laser power is narrowed. On the other hand, when the film thickness is more than 500 nm, the peeling-off of the amorphous semiconductor layer 3 easily takes place at the time of irradiating the laser beams. A film thickness range of 50-400 nm is more preferable. In place of the amorphous semiconductor, a microcrystalline semiconductor wherein fine crystal particles having the particle size of less than 50 μm are contained, or a polycrystalline semiconductor may be used. In a case of using the polycrystalline semiconductor, it is subjected to laser irradiation to improve the crystallinity, whereby the magnification rate of current can be increased.

Although a description will be made in the following as to the amorphous semiconductor as the representative example of the present invention, the present invention is also applicable to a case of using the microcrystalline semiconductor or the polycrystalline semiconductor in place of the amorphous semiconductor.

Amorphous silicon may be used as the amorphous semiconductor. In this case, it is preferable that the hydrogen content of the amorphous silicon is in a range of 0.5 atomic % to 20 atomic % in order to conduct the step of laser beam annealing stably. When more than 20 atomic % of hydrogen is used, the range of a laser power usable is narrowed and the amorphous silicon film easily peels off. On the other hand, when less than 0.5 atomic % of hydrogen is used, a large amount of laser power is needed. Further, the scanning speed has to be reduced, which invites poor productivity. More preferably, the hydrogen content is in a range of 10 atomic % to 1 atomic %. The above-mentioned amorphous silicon can be formed at a substrate temperature of 350° C. or higher with use of a plasma CVD method, or can be formed by controlling a partial pressure of hydrogen in a reaction vessel with use of a sputtering method or an ionized cluster beam deposition method, or can be formed with use of an LP CVD method or the like. Further, the amorphous silicon can be formed with use of the plasma CVD method wherein amorphous silicon having a hydrogen content of about 20 atomic % or more is heated at 450° C. or higher to expel hydrogen, so that the hydrogen content becomes about 10 atomic % or lower.

For controlling the threshold voltage of a thin film transistor, the amorphous semiconductor may contain impurities such as B or P uniformly or non-uniformly in the direction of the film thickness in an amount of from several tens PPM to several hundreds PPM.

A photolithography method is used to form the amorphous semiconductor layer 3 in a pattern, and a gate insulating film 4 of a single layer or a multilayer of SiOx, SiNx, SiOxNy, TaOx or the like is formed on the patterned amorphous semiconductor layer 3 by using the plasma CVD method, the sputtering method, the LP CVD method, the AP CVD method or the like. Further, a gate material (which is used as a gate electrode) of a single layer or a multilayer of Cr, Ta, Al or the like is formed on the gate insulating film 4 by using a vacuum deposition method or the sputtering method. The photolithography method is again used to form a conductive portion 5, which is used as the gate electrode, into the same pattern as the gate. The gate insulating film 4 is partially or entirely subjected to etching to have the same pattern as the gate, if required. Further, impurity ions such as P, B, As or the like are doped at an acceleration voltage of 1-100 kV and in an amount of $5 \times 10^{14} - 1 \times 10^{16}$ atoms/cm$^2$ in a portion to be used for a source-drain region of the amorphous semiconductor layer 3 by using the gate as a mask and an ion implantation method. At this moment, ions of H, F or the like may be simultaneously implanted or molecule ions such as PHx, BxHy, BFx or the like may be simultaneously implanted.

Figure 4:
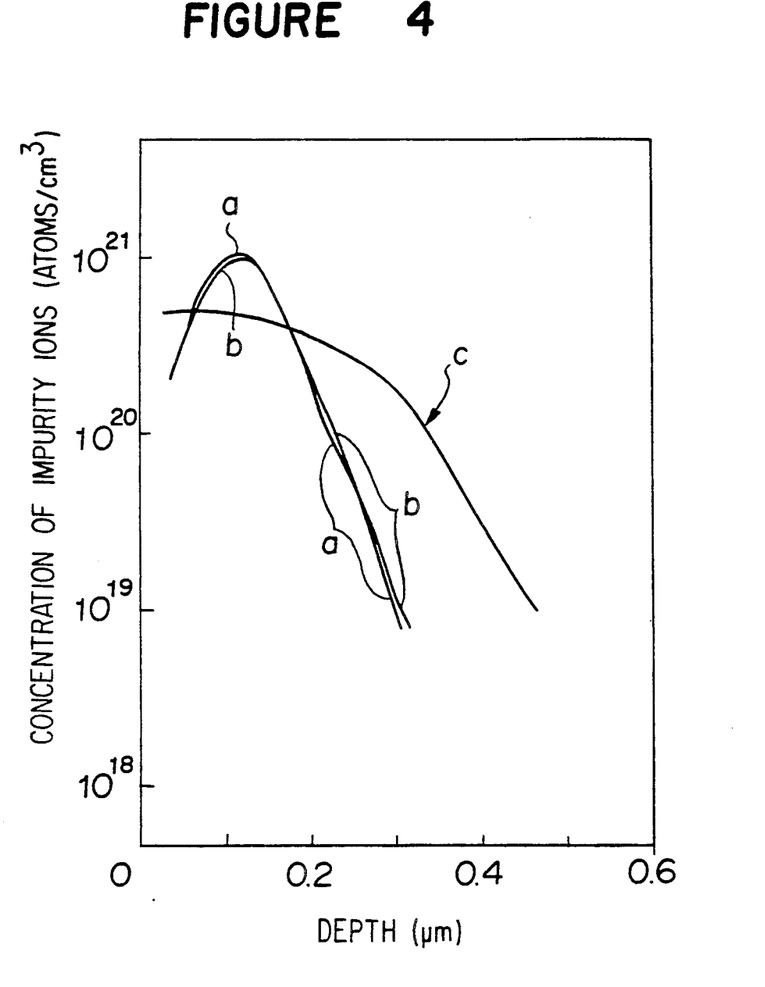
FIG. 4 is a diagram showing impurity ion distribution in a thin film of silicon before and after the irradiation of laser beams.

The gate which functions as a mask prevents the doping of P or B to the portion of the amorphous semiconductor 3 under the gate, and accordingly, it is unnecessary to determine the positional relation between the source-drain region and the gate, the positions being naturally (in a self-aligning manner) determined. Laser beams 6 are irradiated to the transparent insulating substrate 1 from its back surface side whereby the polycrystallization of the amorphous semiconductor layer 3 and activation of the impurity ions are simultaneously effected. The laser used may be a continuous wave argon ion laser, a krypton ion laser, a XeCl excimer laser or the like. Especially, it is preferable to scan the argon ion laser at a high speed from the viewpoint of productivity and stability. The high speed scanning is conducted at a scanning speed of a beam spot diameter $\times 5{,}000$/sec or higher. With use of the scanning speed, the amorphous semiconductor is polycrystallized without it becoming a completely molten state. FIG. 4 shows the fact that the distribution of ions in the semiconductor does not change before and after the irradiation of the laser beam.

FIG. 4 shows the distribution of the concentration of the impurities (boron B) in the direction of depth of the silicon thin film, which is measured by the secondary ion mass spectrometry (SIMS). In FIG. 4, a curve a indicates distribution of the concentration of boron in a state that B+ ions are implanted in amorphous silicon at an acceleration voltage of 40 kV, but it is not subjected to a heat treatment at all. A curve b indicates distribution of the concentration of boron B after the annealing and polycrystallization by argon ion laser beams having a beam diameter of 50 μm and a beam energy of 8 W, and at a scanning speed of 10 m/s. A curve c indicates distribution of the concentration of boron B after the annealing and polycrystallization by a pulse XeCl excimer laser having an energy of 0.8 J/cm$^{-2}$. The curve c shows that Si in silicon is diffused and the silicon is completely molten when polycrystallized. On the other hand, the curve b does not show a substantial change in comparison with the curve a, and it is considered that the melting of the silicon has not taken place.

The irradiation of the laser beams may be conducted in the atmosphere, in a vacuum condition or in an atmosphere of nitrogen or hydrogen. The substrate may be heated or cooled. However, it is desirable that the substrate is treated at the room temperature in the atmosphere from the standpoint of productivity because influence due to difference in conditions is small in a case that a high speed scanning by the argon ion laser is conducted.

Further, an interlayer insulating film 7 is formed on the annealed and polycrystallized product; contact holes are formed in the source-drain region, and the source and drain 8 are provided on the source-drain region. The final product produced is a thin film transistor having polycrystalline portions 9, 10 of a low resistance in which the impurity ions such as P, B or the like are doped and a polycrystalline semiconductor 11 of a low resistance for the source-drain region. The region of the polycrystalline semiconductor 11 is referred to as a channel region.

Another embodiment of the process for preparing a polycrystalline semiconductor thin film transistor will be described. This method is to apply laser beams to a non-singlecrystalline semiconductor formed on an insulating substrate to thereby effect beam annealing and polycrystalline to the semiconductor.

First of all, a gate insulating film is formed on the non-singlecrystalline semiconductor. Then, a non-singlecrystalline semiconductor is formed as a semiconductor for a gate electrode on the gate insulating film. Impurity ions are implanted into the semiconductor for the gate electrode and the non-singlecrystalline semiconductor on the insulating substrate at a source-drain region. Thereafter, laser beams are irradiated to the semiconductor and the non-singlecrystalline semiconductor so that the non-singlecrystalline semiconductor on the insulating substrate at the channel region is polycrystallized or exhibits an improvement of crystallinity; the semiconductor for the gate electrode and the non-singlecrystalline semiconductor on the insulating substrate at the source-drain region is polycrystallized and activated; or they exhibit an improvement of crystallinity and activation, the improvement of crystallinity and the activation being effected simultaneously.

The method in accordance with the second embodiment of the present invention will be described with reference to FIGS. 2a, 2b and 2c.

Figure 2A:
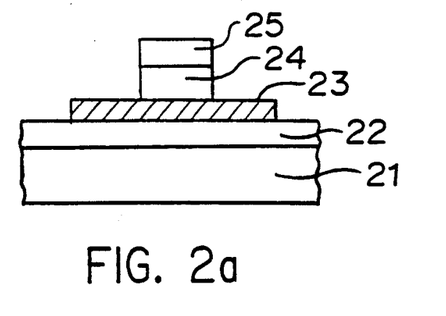
FIG. 2a is a cross-sectional view showing the initial stage of another embodiment of the process for preparing a polycrystalline semiconductor thin film transistor according to the present invention.
Figure 2B:
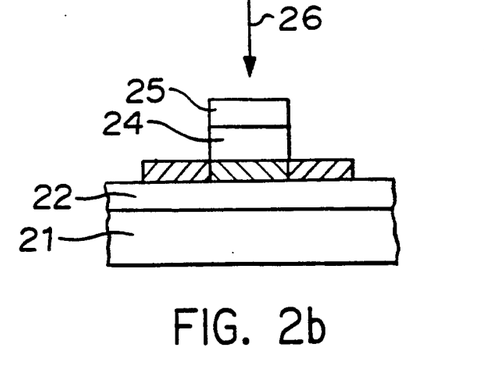
Figure 2C:
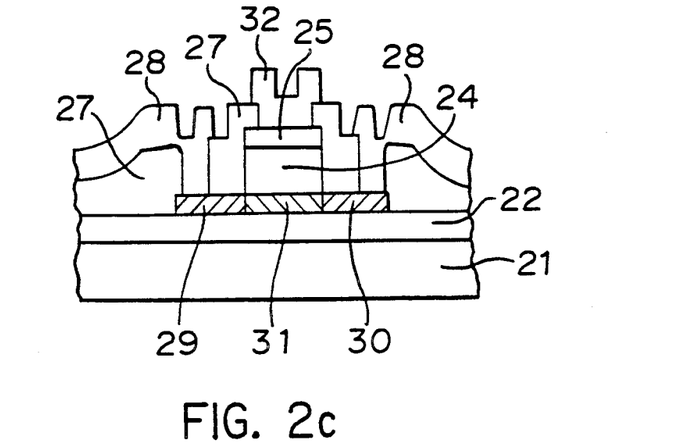
FIG. 2c is a cross-sectional view showing the final stage of the process according to the second embodiment of the present invention.

In FIGS. 2a, 2b and 2c, a passivation film 22 (having a film thickness of 50 nm-1,000 nm) of a single layer or a multilayer of SiOx, SiNx, SiOxNy, TaOx or the like, and an amorphous semiconductor layer 23 (having a film thickness of 10 nm-500 nm) of Si, Ge or the like, which serves as a non-singlecrystalline semiconductor, are formed on the transparent insulating substrate 1 such as glass, ceramic, plastic or the like with use of a plasma CVD method, a sputtering method, an LP CVD method, an AP CVD method or the like. The film thickness of the amorphous semiconductor and the quality of film such as the hydrogen content are the same as in the first embodiment.

A photolithography method is used to form the amorphous semiconductor layer 23 in a form of pattern, and a gate insulating film 24 of a single layer or a multilayer of SiOx, SiNx, SiOxNy, TaOx or the like is formed on the patterned amorphous semiconductor layer 23 with use of the plasma CVD method, the sputtering method, the LP CVD method, the AP CVD method or the like. Further, a non-crystalline semiconductor made of a material such as Si, Ge or the like is formed as a semiconductor material for the gate electrode is formed on the gate insulating film 24. The semiconductor material for the gate electrode is preferably the same material as the amorphous semiconductor layer on the insulating substrate from the standpoint of stability in a laser beam annealing process. However, an amount of impurities such as B, P or the like may be contained in order to increase the electrical conductivity of the gate electrode.

The photolithography method is again used to form the amorphous semiconductor in the same pattern that of the gate, whereby the gate semiconductor 25 is formed. The gate insulating film 24 may be etched partially or entirely to have the same pattern as the gate. By using the gate as a mask, impurity ions such as P, B, As or the like are doped by an ion implantation method to the portions 29, 30 which constitute the source-drain regions in the amorphous semiconductor layer 23 at an acceleration voltage of 1–100 kV and in an amount of $5\times10^{14}$–$1\times10^{16}$ atoms/cm$^2$, In the ion implantation method, ions such as H, F or the like may be implanted together with the above-mentioned impurity ions, or molecule ions such as PHx, BxHy, BFx or the like may be simultaneously implanted. In this case, the above-mentioned impurity ions are simultaneously doped into the amorphous gate semiconductor 25.

By using the gate as a mask, the P ions or the B ions are not doped in the portion of the amorphous semiconductor 23 under the gate, and accordingly, it is unnecessary to match the position of the source-drain region with the gate, and the position is naturally (or in a self-matching manner) determined. Then, the laser beams 26 are irradiated so that the polycrystallization of the amorphous semiconductor layer 23 and the activation of the impurity ions are simultaneously conducted. By optimizing the thickness of the thin film and the layers and the condition of laser beam irradiation, the gate semiconductor 25 as the amorphous semiconductor and portions 29, 30, 31 which correspond to the source-drain region of the amorphous semiconductor layer and the channel region can be polycrystallized simultaneously by irradiating once the laser beams.

The scanning speed by the laser beams and other conditions are the same as those in the embodiments described before.

Prior to the irradiation of the laser beams, the insulating film such as SiOx, SiNx, SiOxNy, TaOx or the like may be formed as an anti-reflection film in a thickness range of 10–300 nm.

Further, an interlayer insulating film 27 is formed on the polycrystallized layers; contact holes are respectively formed on the source-drain region and the gate electrode; and a electric conducting portion 28 used as the electrodes of the source and drain and an electric conducting portion 32 which is used as the electrode of the gate are respectively formed. The thus obtained product is a thin film transistor having polycrystalline portions 29, 30 of a low resistance in which the impurity ions such as P, B or the like are doped, the polycrystalline semiconductor 21 and the polycrystalline semiconductor of a low resistance as the source-drain region.

The polycrystalline semiconductor 31 is referred to as a channel region.

The scanning speed of the laser beams used in the present invention is preferably a beam spot diameter $\times$ 5,000/sec or more. It is usually at most a beam spot diameter $\times$ 500,000/sec. The most preferable range of the scanning speed of the laser beams is 3 m/sec+20 m/sec. With use of the above-mentioned scanning speed, the amorphous semiconductor thin film is polycrystallized without causing a completely molten state; thus, a polycrystalline semiconductor thin film is obtainable. The reason why the polycrystalline semiconductor thin film can be produced will be described in connection with a change in the amorphous semiconductor thin film at the time of scanning of the laser beams and the laser power at the scanning.

When the laser power is increased from a sufficiently small value at a certain scanning speed, there appears a first laser power threshold value at which the amorphous semiconductor thin film begins to show the crystallization to become the polycrystalline semiconductor thin film. The crystallization of the amorphous semiconductor thin film without having the completely molten state will be described in detail later. When the laser power is further increased, the semiconductor thin film becomes a molten state and a second laser power threshold value is found. Accordingly, in order to obtain the polycrystalline semiconductor thin film in a stable manner, it is necessary to select the magnitude of the irradiated laser power between the first and second laser power threshold values. However, when the scanning speed is low, the gap between the laser power threshold values becomes small. When the scanning speed is further slowed down. A set margin for the laser power which can form stably the polycrystalline semiconductor thin film can never exist. On the other hand, when the scanning speed is high, the first and second laser power threshold values are both increased in comparison with the case of a lower scanning speed, and the gap between the first and second laser power threshold values is broaden to thereby expand the set margin for the laser power. In the present invention, the scanning speed is a beam spot diameter×5,000/sec or more. The reason why a preferable range of the scanning speed exists with respect to the beam spot diameter is that if a portion to be irradiated is sufficiently smaller than a beam spot diameter and scanning is carried out at a certain speed, a time of irradiation is in proportion to the beam spot diameter and an energy of irradiation is substantially in proportion to the time of irradiation. From the reason described above, the scanning speed is preferably a beam spot diameter×5,000/sec or more.

Thus, the amorphous semiconductor thin film is crystallized without reaching a completely molten state, and it is transformed into a polycrystalline semiconductor thin film in an extremely short time. Accordingly, it is possible to use a glass substrate which has a low heat resistance and is inexpensive. Further, the size of the substrate can be easily increased. In addition, since the set margin for the laser power can be expanded, the temperature control can be easy and the scanning speed is high, whereby the productivity is increased.

In the scanning and irradiating of the laser beams on the amorphous silicon film, an insulation film, such as a silicon oxide film, a silicon nitride film or the like may be previously formed on the amorphous semiconductor thin film so as to use it as an anti-reflection film or a surface protective film to the laser beams.

In the following, several preferred Examples will be described. However, the present invention is not restrictive to these Examples.

EXAMPLE 1

On a glass substrate (AN glass manufactured by Asahi Glass Company Ltd.), a passivation film of SiOx having a film thickness of 200 nm and an amorphous semiconductor layer of a-Si having a film thickness of 100 nm were respectively formed at a temperature of glass substrate of 450° C. with use of a plasma CVD method. The hydrogen content of the a-Si layer was about 5 atomic %. Then, a photolithography method was applied to the a-Si layer to form it into an island-like pattern. On the island-patterned a-Si layer, a gate insulation film of SiON having a thickness of 200 nm at 300° C. was formed by the plasma CVD method. On the gate insulation film, a gate material of Cr was formed at a thickness of 150 nm at 300° C. by using an electron beam heat-vapor deposition method. With use of the photolithography method, an electric conducting portion which corresponds to the electrode of a gate was formed to have the pattern as the gate, and the gate insulation film was etched in the same pattern as the gate. By using the gate of Cr as a mask, P ions were doped in a portion for a source-drain region corresponding to the island-like pattern in the a-Si layer at an acceleration voltage of 10 kV and a dose of $2\times10^{15}$ atoms/cm$^2$. 8W argon ion laser beams having a diameter of about 50 μm were irradiated from the back surface of the glass substrate so that the polycrystallization of the a-Si layer and the activation of the impurity ions were simultaneously effected. The scanning speed of the laser beams was 13 m/s ($2.6\times10^5$ times/sec of the beam spot diameter). Then, SiON was formed as an interlayer insulation film at a thickness of 300 nm. Contact holes were formed on the source-drain region, and electric conducting portions which are used as electrodes for the source and drain were formed on the contact holes. Thus, 100 TFTs were formed on the same and single substrate. The measurement of the electrical conductivity of the source-drain region revealed that all 100 TFTs showed $80\Omega^{-1}\text{cm}^{-1}$ or more.

EXAMPLE 2

A passivation film of SiOx having a film thickness of 200 nm and an amorphous semiconductor layer of a-Si having a film thickness of 200 nm were formed on a glass substrate (7059 manufactured by Corning) at a substrate temperature of 300° C. with use of a plasma CVD method. The hydrogen content of the a-Si layer was about 18 atomic %. The glass substrate with the passivation film and the amorphous semiconductor layer was subjected to a heat treatment in a nitrogen atmosphere at 450° C. for 30 minutes. As a result, the oxygen content of the a-Si layer was reduced to about 10%. A photolithography method was used so that the a-Si layer was formed into an island-like pattern, and a gate insulation film of SiNx having a film thickness of 250 nm was deposited on the patterned a-Si layer at 350° C. by using a plasma CVD method. Further, an Al layer of 150 nm thick was formed as a gate material, at 150° C. by a sputtering method. The photolithography method was again used to form an electric conducting portion as the electrode of a gate so as to have the pattern of the gate. The gate insulation film was etched to have the same pattern as the gate. By using the gate of the Al layer as a mask, BFx ions (X=0-3) were doped by an ion implantation method into the portion where the island-like patterned source-drain region in the a-Si layer was formed, at an acceleration voltage of 20 kV and a dose of $4 \times 10^{15}$ atoms/cm$^2$. 9W argon ions laser beams having a diameter of about 100 μm was irradiated to the deposited body from the back surface side of the glass substrate so that the polycrystallization of the a-Si layer and activation of impurity ions were simultaneously effected. In this case, the scanning speed of the laser beams was 1.2 m/s ($1.2 \times 10^4$ times/sec of the beam spot diameter) on the body. A SiON layer of 300 nm thick was overlaid as an interlayer insulation film; contact holes were formed in a source-drain region; and an electric conducting portion used as the electrodes of the source and the drain was formed. Thus, 100 TFTs were formed on the same and single substrate. The electrical conductivity of the source-drain region was measured. As a result, all 100 TFTs showed 40 $\Omega^{-1}$cm$^{-1}$ or more.

EXAMPLE 3

On a glass substrate (AN manufactured by Asahi Glass Company Ltd.), a passivation film of SiOx having a thickness of 200 nm and an amorphous semiconductor layer of a-Si having a thickness of 100 nm were formed at a substrate temperature of 450° C. with used a plasma CVD method. The hydrogen content of the a-Si layer was about 5 atomic %. A photolithography method was used to the deposited body so that the a-Si layer was patterned into an island-like form. A gate insulation film of SiON having a thickness of 200 nm was formed on the a-Si layer at 300° C. by using the plasma CVD method. As a semiconductor material for a gate electrode, an a-Si layer having a thickness of 50 nm was formed in the same conditions as the preparation of the amorphous semiconductor layer. The a-Si layer was subjected to a photolithography method so that it was formed into the same pattern as the gate electrode. The gate insulation film was also etched to have the same pattern as the gate. P ions were doped by an ion implantation method to the portions of the a-Si layer as the gate electrode and a source-drain region formed in the island-like pattern of the a-Si layer formed on the glass substrate at an acceleration voltage of 10 kV and a dose of $2 \times 10^{15}$ atoms/cm$^2$. 10W argon ion laser beams were focused to have a diameter of about 50 μm and the laser beams were irradiated on the deposited body so that the polycrystallization of the semiconductor for the gate electrode, the channel region and the a-Si layer for the source-drain region and the activation of impurity ions to the semiconductor for the gate electrode and the source-drain region were simultaneously effected. In the irradiation of the laser beams, the scanning speed was 13 m/s. Further, a SiON layer of 300 nm thick as an interlayer insulating film was formed on the polycrystalline layer; contact holes were formed on the gate electrode and the source-drain region; and an electric conducting portion used as the electrode of a gate and an electric conducting portion used as the electrodes for a source and drain were formed. Thus, 100 TFTs were formed on the same and single substrate. The electrical conductivity of the source-drain region was measured. As a result, all 100 TFTs showed 80$\Omega^{-1}$cm$^{-1}$ or more.

EXAMPLE 4

A passivation film of SiOx having a thickness of 200 nm and an amorphous semiconductor layer of a-Si having a thickness of 200 nm were formed on a glass substrate Corning 7059) at a substrate temperature of 300° C. with use of a plasma CVD method. The hydrogen content of the a-Si layer has about 18 atomic %. The a-Si layer was formed into an island-like pattern by a photolithography method. A gate insulation film of SiNx having a thickness of 250 nm was deposited on the a-Si layer having the island-like pattern at 350° C. by the plasma CVD method. Further, as a semiconductor material for the gate electrode, an a-Si layer having a thickness of 50 nm was formed in the same conditions as the preparation of the amorphous semiconductor layer. The deposited body was subjected to a heat treatment at 450° C. for 30 minutes in a nitrogen flow so that the hydrogen content of the a-Si layer was reduced to about 10%. The photolithography method was again used to form the a-Si layer into the pattern of a gate electrode 5. The gate insulation film was etched to have the same pattern as the gate. BFx ions (x=0–3) were doped by an ion implantation method into the portions of the a-Si layer for the gate electrode and the source-drain region in the island-like a-Si layer on the glass substrate at an acceleration voltage of 20 kV and a dose of $4 \times 10^{15}$ atoms cm$^2$. Then, an anti-reflection film of SiOxNy having a thickness of 80 nm was formed on the body. Thereafter, 9W argon ion laser beams were focused to have a diameter of about 100 μm, and the laser beams were irradiated so that the polycrystallization of the a-Si layer and the activation of the impurity ions were simultaneously effected. The scanning speed of the laser beams was 1.2 m/s. Further, a SiOxNy layer of 250 nm thick was deposited as an interlayer insulation film; contact holes were formed on the gate electrode and the source-drain region; and an electric conducting portion for the gate electrode and an electric conducting portion for the source-drain electrodes were formed on the gate electrode and the source-drain region. Thus, 100 TFTs were formed on the same and single substrate. The electrical conductivity of the source-drain region was measured. As a result, all 100 TFTs showed 40 $\Omega^{-1}$cm$^{-1}$ or more.

EXAMPLE 5

TFTs were prepared in the same manner as the conditions of Examples 1, 2, 3 and 4 except that the film thickness of the a-Si layer was 50 nm, 300 nm and 400 nm. The measurement of the sheet resistance revealed the same result as those in Examples 1, 2, 3 and 4.

EXAMPLE 6

TFTs were prepared in the same manner as the conditions in Examples 1, 2, 3 and 4 except that the hydrogen content of the a-Si layer was 4, 6, 8 and 10 atomic %. The measurement of the electrical conductivity of the TFTs revealed the same result as those of Examples 1, 2, 3 and 4.

EXAMPLE 7

TFTs were prepared in the same manner as the conditions in Examples 1, 2, 3 and 4 except that the temperature of the glass substrate just before the irradiation of the laser beams was 10°, 30°, 50° and 80° C. The measurement of the electrical conductivity of the TFTs revealed the same result as Examples 1, 2, 3 and 4.

EXAMPLE 8

Active matrix substrates each having a 10 cm$^3$ square glass substrate on which 100,000 TFTs are formed were prepared in accordance with the same process as described in Examples 1–7.

Opposing substrates each having a glass substrate of the same size on which opposing electrodes are formed were prepared.

Cells were formed by bonding respectively the active matrix substrates and the opposing substrates interposing spacers therebetween, and then, liquid crystal was filled in each of the spaces formed between of the active matrix substrates and the opposing substrates whereby liquid crystal display substrates were prepared.

Each of the liquid crystal display substrates and each light source were put in each box to prepare liquid crystal display devices.

They showed picture images having brightness and a high contrast.

The liquid crystal display devices of the present invention may be prepared in accordance with specifications other than the above-mentioned.

COMPARATIVE EXAMPLE

As a Comparative Example, a case that impurity ions are activated by a heat treatment will be described.

A passivation film of SiOx having a film thickness of 200 nm and an amorphous semiconductor layer of a-Si having a thickness of 200 nm were formed by a plasma CVD method on a glass substrate (Corning 7059) at a substrate temperature of 300° C. The hydrogen content of the a-Si layer was about 18%. A heat treatment was conducted at 450° C. for 30 minutes in a nitrogen flow so that the hydrogen content of the a-Si layer was reduced to about 10%. 6W argon ion laser beams were focused to have a diameter of about 50 $\mu$m and the focused laser beams were irradiated at a scanning speed of 13 m/s so as to polycrystallize the a-Si layer. Then, the poly-Si layer was formed in an island-like pattern by using a photolithography method. A gate insulation film of SiNx having a thickness of 250 nm was formed on the patterned poly-Si layer at 350° C. with use of the plasma CVD method. Further, as a gate material, Al was vapor-deposited at 150° C. by a sputtering method to form an Al layer of 150 nm thick. Then, an electric conducting portion used for a gate electrode was formed into the pattern of the gate by the photolithography method, and the gate insulation film was etched to have the same pattern as the gate. With use of the gate of Al as a mask, BFx ions (x=0–3) were doped by an ion implantation method to the portion of the island-like poly-Si layer as a source-drain region at an acceleration voltage of 20 kV and a dose of $4 \times 10^{15}$ atoms cm$^2$. Heat treatments for activating the impurity ions were conducted respectively at 300° C., 400° C. and 550° C. for 60 minutes. Further, a SiON layer was formed as an interlayer insulation film at a thickness of 300 nm; contact holes were formed on the source-drain region; and an electric conducting portion used for the electrodes of source and drain was formed on the source-drain region. Thus, 100 TFTs were formed on the same and single substrate. The electrical conductivity of the source-drain region was measured. As a result, the substrate which was subjected to the heat treatment for activation at 300° C. exhibited an electrical conductivity of about 0.5 $\Omega^{-1}$cm$^1$ which is insufficient as electrical conductivity. The substrate which was subject to the heat treatment of 400° C. exhibited an electrical conductivity of about 4 $\Omega^{-1}$cm$^{-1}$ which is still insufficient as electric conductivity. Further, there was damage by heat in an Al wiring and there was found so-called hillock. The substrate which was subjected to the heat treatment of 550° C. showed an electrical conductivity of about 40 $\Omega^{-1}$cm$^{-1}$ which fairly improved electrical conductivity. However, the Al wiring was severely damaged and there was found the breaking of . wiring at a part. Further, the heat treatment of 550° C. caused great shrinkage and deformation in the glass substrate. In particular, there was found a shrinkage of about 4 $\mu$m to 100 mm. Accordingly, it is considered to be impossible to use a glass substrate having a large surface area. In accordance with the present invention, it is possible to greatly improve the electrical conductivity of the source-drain region in comparison with the conventional process wherein impurity ions are activated by heat. For instance, in a case of an n type semiconductor wherein P ions are implanted, the substrate subjected to a conventional heat treatment method (500° C., one hour) exhibits an electrical conductivity of about 7 $\Omega^{-1}$cm$^{-1}$, and on the other hand, in accordance with the method of the present invention using the laser beam irradiation, it exhibits an electrical conductivity of about 80 $\Omega^{-1}$cm$^{-1}$ which shows an improvement of one figure or more. This results in increasing an ON current of the transistor while an OFF current remains unchanged, whereby the driving performance of the TFT is increased to thereby increase the number of the scanning lines of an active matrix, hence, it is possible to produce a further precise display device. Further, since no heat treatment is used, a glass substrate having a low heat resistance, which will increase processability, can be used. As the substrate, one having a large surface area can be used, so that a display device having a large surface area can be realized. Further, by using the substrate having a large surface area, a plurality of TFT products can be manufactured, which can reduce cost for manufacturing. Since no heat treatment is conducted, aluminum having a low melting point and resistance can be used as a material for wiring, whereby a problem of causing an increase in resistance in the wiring of the display device having a large surface area can be eliminated.

Further, in accordance with the process of the present invention, the polycrystallization of the channel portion is simultaneously conducted, and accordingly, a step of heat treatment for activating the source-drain region, which was employed in the conventional process, is unnecessary, hence, the number of step can be reduced.

What is claimed is:

1. A process for preparing a polycrystalline semiconductor thin film transistor, comprising the steps of:
    forming a non-singlecrystalline semiconductor layer formed of amorphous silicon and having a thickness of 10–500 nm on a front surface side of a transparent substrate;
    forming a gate insulation layer on the non-singlecrystalline semiconductor layer;
    forming a gate electrode of non-singlecrystalline semiconductor on the gate insulation layer at a channel region;
    implanting impurity ions into the gate electrode and a source-drain region of said non-singlecrystalline semiconductor layer formed of amorphous silicon, wherein the gate electrode of semiconductor is used as a mask;
    irradiating laser beams so that simultaneously the non-singlecrystalline semiconductor at the channel region is polycrystallized, the non-singlecrystalline semiconductor at the source and drain region is polycrystallized, said impurity ions implanted into the non-singlecrystalline semiconductor at the source-drain region are activated, and said impurity ions implanted into the gate electrode are activated and the non-singlecrystalline semiconductor of the gate electrode is polycrystallized, without causing said non-singlecrystalline semiconductor layer to reach a molten state.

2. The process for preparing a polycrystalline semiconductor thin film transistor according to claim 1, wherein the scanning speed of the laser beams is a beam spot diameter×5,000/sec or higher.

3. The process for preparing a polycrystalline semiconductor thin film transistor according to claim 1, wherein a hydrogen content of the non-singlecrystalline semiconductor is 0.5-20 atomic percent.

4. The process for preparing a polycrystalline semiconductor thin film transistor according to claim 1, wherein the laser beams are continuous-wave argon ion laser beams.

5. The process for preparing a polycrystalline semiconductor thin film transistor according to claim 1, wherein the impurity ions are implanted at an acceleration voltage of 1-100 kV and in an amount of $5 \cdot 10^{14} - 1 \cdot 19^{16}$ atoms/cm$^2$.

* * * * *